United States Patent
Lamanna et al.

(10) Patent No.: US 6,555,510 B2
(45) Date of Patent: Apr. 29, 2003

(54) BIS(PERFLUOROALKANESULFONYL) IMIDES AND THEIR SALTS AS SURFACTANTS/ADDITIVES FOR APPLICATIONS HAVING EXTREME ENVIRONMENTS AND METHODS THEREFOR

(75) Inventors: William M. Lamanna, Stillwater, MN (US); Patricia M. Savu, Maplewood, MN (US); Michael J. Parent, Oakdale, MN (US); Lawrence A. Zazzera, Edina, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 09/853,065

(22) Filed: May 10, 2001

(65) Prior Publication Data

US 2003/0036569 A1 Feb. 20, 2003

(51) Int. Cl.⁷ .......................... C09K 13/08; B01F 17/00
(52) U.S. Cl. ...................... 510/175; 510/176; 134/1.3; 516/79; 516/89; 516/93; 516/198; 516/201; 252/79.1; 252/79.3; 252/286.29; 106/1.23; 51/308
(58) Field of Search .................. 516/198, 201, 516/79, 89, 93; 564/82; 252/186.29, 79.1, 79.3; 510/175, 176; 106/1.23; 51/308; 134/1.3

(56) References Cited

U.S. PATENT DOCUMENTS

| | | | |
|---|---|---|---|
| 2,292,997 A | * 8/1942 | Hentrich et al. | 564/82 |
| 2,701,814 A | 2/1955 | Smith | 564/209 |
| 2,732,398 A | 1/1956 | Brice et al. | 562/30 |
| 3,718,596 A | 2/1973 | Richard, Jr. | 252/78.5 |
| 3,723,320 A | 3/1973 | Herber et al. | 252/78.5 |
| 4,206,067 A | 6/1980 | MacKinnon | 252/75 |
| 5,464,551 A | 11/1995 | Deetman | 252/78.5 |
| 5,502,251 A | 3/1996 | Pohmer et al. | 564/82 |
| 5,688,884 A | 11/1997 | Baker et al. | 526/225 |
| 5,723,664 A | 3/1998 | Sakaguchi et al. | 564/82 |
| 5,873,931 A | * 2/1999 | Scholz et al. | 106/2 |
| 5,874,616 A | 2/1999 | Howells et al. | 564/82 |
| 6,297,398 B1 | * 10/2001 | Pevere et al. | 564/82 |

FOREIGN PATENT DOCUMENTS

| | | |
|---|---|---|
| DE | 2 239 817 | 2/1974 |
| EP | 0 571 832 A2 | 12/1993 |
| WO | WO 93/25641 | 12/1993 |
| WO | WO 99/30381 | 6/1999 |
| WO | WO 00/24848 | 5/2000 |

OTHER PUBLICATIONS

Razaq et al., "Perfluorosulfonimide as an Additive in phosphoric Acid Fuel Cell", Journal of the Electrochemical Society, vol. 136, No. 2, Feb. 1989, pp. 385–390..*

(List continued on next page.)

*Primary Examiner*—Daniel S. Metzmaier
(74) *Attorney, Agent, or Firm*—Lisa M. Fagan

(57) ABSTRACT

The present invention provides for the use of bis (perfluoroalkanesulfonyl)imide and its salts as surfactants or additives applications having an extreme environment.

7 Claims, 6 Drawing Sheets

OTHER PUBLICATIONS

U.S. patent application Ser. No. 09/698,987, filed Oct. 27, 2000, entitled "Fluorochemical Sulfonamide Surfactants."

Book Excerpt: Banks et al., *Preparation, Properties, and Industrial Applications of Organofluorine Compounds*, Ellis Horwood Limited, 1982 Month unknown, p. 37.

Article: Burkman et al., "Understanding and Specifying the Sources and Effects of Surface Contamination in Semiconductor Processing," *Microcontamination*, Nov. 1988, pp. 57–62, 107, and 110–111.

Product Application Report: Shah et al., "Change Your Surfactant Formula and Use Etch Baths for a Week," *Semiconductor International*, Oct., 1988.

Book Excerpt: Kissa, *Fluorinated Surfactants*, Marcel Dekker, Inc., 1994, Month unknown, p. 134.

Symposium Excerpt: Zisman, "Contact Angle, Wettability, and Adhesion," Advances in Chemistry Series 43, American Chemical Society, 1964, Month unknown, p. 22.

Article: Brace, "Long Chain Alkanoic and Alkenoic Acids with Perfluoroalkyl Terminal Segments[1]," *Alkanoic Acids with Perfluoroalkyl Terminal Segments*, Vo. 27, Dec., 1962, pp. 4491–4498.

Article: Bernett et al., "Wetting of Low–Energy Solids by Aqueous Solutions of Highly Fluorinated Acids and Salts," *J. Phys. Chem.*, vol. 63, Nov., 1959, pp. 1911–1916.

Article: Hendricks, "Industrial Fluoro–Chemicals," *Industrial and Engineering Chemistry*, vol. 45, No. 1, Jan., 1953, pp. 98–105.

Book Excerpt: *Organofluorine Chemicals and their Industrial Applications*, edited by R. E. Banks, Ellis Horwood Ltd., 1979, Month unknown, p. 56.

Book Excerpt: *Amphoteric Surfactants*, edited by Eric G. Lomax, Marcel Dekker Inc., 1996, Month unknown, p. 13.

* cited by examiner

BIS(PERFLUOROALKANESULFONYL) IMIDES AND THEIR SALTS AS SURFACTANTS/ADDITIVES FOR APPLICATIONS HAVING EXTREME ENVIRONMENTS AND METHODS THEREFOR

FIELD OF INVENTION

This invention relates to the use of bis (perfluoroalkanesulfonyl)imide and its salts as surfactants (surface active agents) or additives in aqueous and nonaqueous (or organic) solutions. More particularly, this invention relates to bis(perfluoroalkanesulfonyl)imides and their salts as surfactants or additives in solutions for applications having an extreme environment.

BACKGROUND OF THE INVENTION

Surfactants or surface active agents are generally described as any compound that reduces surface tension when dissolved in a solution (e.g., water) or that reduces interfacial tension between two liquids or between a liquid and a solid. An additive is defined herein as any compound that when added to a base hydraulic fluid improves the erosion performance of that hydraulic fluid. The choice of surfactant/additive varies with the application, system, or solution where it is employed. Some factors that are considered when evaluating the utility of a surfactant/additive include: solubility of the surfactant/additive in the system used, pH, ultimate surface tension required for spreading and/or for leveling, how corrosive the system components are, conductivity required, and volatility of the surfactant.

Surfactants are used in a variety of applications including aqueous and non-aqueous (i.e., organic) solutions. Applications that involve an extreme or a harsh environment include, but are not limited to, etching solutions used in preparation of semiconductor devices, electrochemical plating and polishing solutions, wafer cleaning and polishing solutions, anisotropic etching solutions, electrolytes for alkaline batteries, and developer solutions for semiconductor manufacture. An "extreme" or "harsh" environment is defined as an application where a conventional hydrocarbon-based surfactant/additive would be degraded. Degradation is defined herein as protonation of an anionic surfactant or degradation or alteration (e.g., polymerization) of the chemical structure of the surfactant that results in a change in surface tension and thus diminished surfactant performance.

Extreme environment conditions for aqueous solutions include, but are not restricted to, heat, light, radiation, oxidizing/reducing potential, high pressure, high shear, high or low pH, or the presence of corrosive reagents. The pH is generally low (i.e., acidic) or high (i.e., basic). Typically, for aqueous solutions, these applications are minimally both extreme in pH and corrosive.

Extreme environment conditions for non-aqueous solutions include, but are not restricted to, high pressure, high temperature (i.e., at least 200° C.), high shear, environmental (trace water), or corrosive reagents, etc.

Under these conditions, most hydrocarbon surfactants either chemically or physically degrade. Thus, non-hydrocarbon-based surfactants that do not degrade in extreme environments are desirable.

Fluorocarbon surfactants such as, perfluorooctanesulfonyl fluoride (POSF) derived surfactants like $K^{+-}OSO_2C_8F_{17}$ have been used. But these surfactants persist or ultimately degrade in the environment to other perfluorooctyl-containing compounds. It has been reported that certain perfluorooctyl-containing compounds may tend to have low bioelimination rates in living organisms. This tendency has been cited as a potential concern for some fluorochemical compounds. See, for example, U.S. Pat. No. 5,688,884 (Baker et al.). Introduction of a surfactant and its degradation products into the environment may occur either from streams related to the use of the surfactant itself or to waste streams/emissions from its manufacture.

As a result, there is a desire for fluorine-containing compositions that are effective in providing desired surfactant properties, and that eliminate more rapidly from the body (including the composition and its degradation products).

Therefore, the need exists for a surfactant or an additive that works effectively in an extreme environment application, that more rapidly eliminates from living organisms, and that can be manufactured in a cost effective manner. The precursor to these surfactants needs to be less bioaccumulative than POSF derived materials to prevent potentially introducing bioaccumulative materials from manufacturing streams.

SUMMARY OF THE INVENTION

The present invention provides bis (perfluoroalkanesulfonyl)imides and their salts as surfactants or additives in applications having extreme or harsh environments. Advantageously, the surfactants or additives of the present invention are comprised of a perfluorinated imide anion, $^-N(SO_2C_nF_{2n+1})_2$, that is physically and chemically stable while providing outstanding surface activity under chemically harsh or extreme conditions. The surfactants or additives of the present invention furthermore do not readily protonate (even in aqueous solutions of low pH), commonly encountered in many extreme applications due to the very low basicity of the perfluorinated anion. In addition, the surfactants of the present invention can be produced from lower cost intermediates, such as $CF_3SO_2F$ and $C_4F_9SO_2F$, compared to surfactants derived from $C_8F_{17}SO_2F$ (POSF), which is produced in relatively low yields by ECF. Surprisingly, the replacement of perfluorooctanyl based surfactants with surfactants of the present invention is possible without sacrificing surface activity or surfactant performance. Moreover, the surfactants of the present invention will likely more rapidly bioeliminate.

In one aspect, the present invention comprises a method of reducing the surface tension of a solution comprising: (a) providing an aqueous solution that would degrade a hydrocarbon-based surfactant; and (b) adding to said aqueous solution a surface active agent comprising a bis (perfluoroalkanesulfonyl)imide or one of its salts.

Another embodiment of the present invention is a hydraulic fluid comprising: one or more phosphate esters; at least one bis(perfluoroalkanesulfonyl)imide salt additive; and optionally comprising adjuvants selected from the group consisting of viscosity index improvers, acid control components, antioxidant components, lubricants, dyes, corrosion inhibitors, antifoamers and mixtures thereof.

Another aspect of the present invention is an application having an extreme environment wherein said application comprises an aqueous solution comprising a bis (perfluorobutanesulfonyl)imide or one of its salts.

Figure 1:
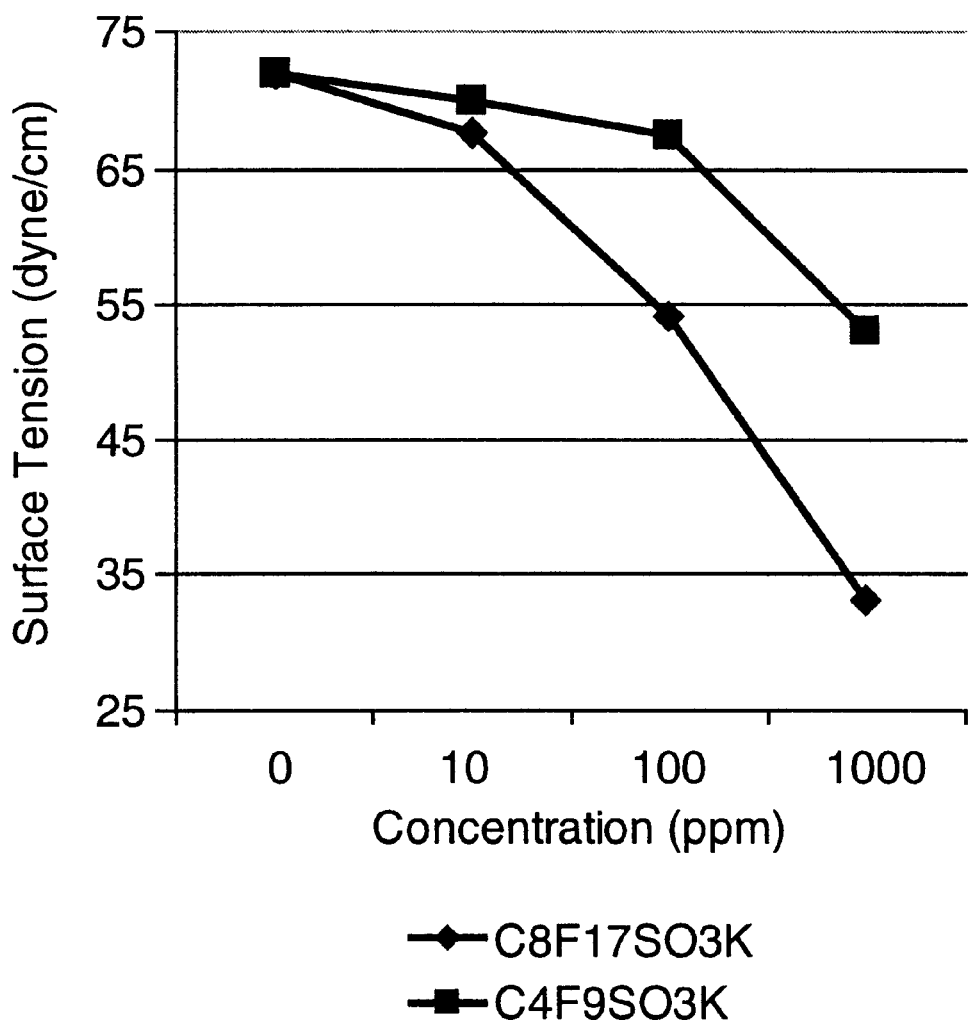
FIG. 1 is a graph of the surface tension (dyne/centimeter) versus concentration (ppm) of potassium salts of perfluorobutanesulfonate and perfluorooctanesulfonate (PFOS) in water.

These figures are intended to be merely illustrative and non-limiting.

DETAILED DESCRIPTION OF ILLUSTRATIVE EMBODIMENTS

The present invention relates to bis (perfluoroalkanesulfonyl)imides and their salts as surfactants or additives in applications having an extreme or a harsh environment. An extreme or harsh environment having an aqueous solution is defined as some combination of conditions such as heat, light, radiation, oxidizing/reducing potential, high pressure, high shear, high (9 to 14) or low (−2 to 5) pH, or the presence of corrosive reagents that would cause conventional hydrocarbon-based surfactants or additives to degrade or protonate.

The surfactants or surface active agents (defined functionally herein as materials which concentrate at the surface of a liquid where it is dissolved or at the interface of a liquid and another immiscible liquid or solid and lower the surface tension or interfacial tension) are used in aqueous solutions in applications of the present invention. Examples of such aqueous solutions include, but are not limited to, buffered oxide etch solutions containing ammonium fluoride and hydrogen fluoride; tetramethyl ammonium hydroxide; an acidic copper plating solution comprising copper sulfate and sulfuric acid; a chemical mechanical polishing (CMP) slurry for copper comprising abrasive particles selected from the group consisting of alumina, silica, and cerium; oxidants, etchants, and corrosion inhibitors; a wafer cleaning solution comprising $H_2O_2$, $O_3$, $H_2SO_4$, $NH_4OH$, or HCl alone or in combination; sodium, ammonium, or potassium hydroxide, quaternary ammonium hydroxides, ethylenediamine, or ethanolamine; and chromium trioxide; or other chromium (VI) ions, and sulfuric acid.

Furthermore, the surfactants or additives of the present invention are useful in nonaqueous (or organic) hydraulic fluids.

Although stable over the relatively short time frame of typical commercial applications, it is expected that the bis(perfluoroalkanesulfonyl)imide surfactants or additives of the present invention, will gradually break down to various degradation products when exposed over long time periods to biological, thermal, oxidative, hydrolytic, and photolytic conditions found in the environment. For example, compositions comprising bis (perfluorobutanesulfonyl)imide anions are expected to slowly, but ultimately degrade, to perfluorobutanesulfonate salts (i.e., salts of $C_4F_9SO_3^-$). It has been surprisingly found that perfluorobutanesulfonate, tested in the form of its potassium salt, eliminates from the body more rapidly than perfluorohexanesulfonate and much more rapidly than perfluorooctanesulfonate.

One aspect of the present invention comprises a method for reducing the surface tension of an aqueous solution by adding a bis(perfluoroalkanesulfonyl)imide or its salts to the aqueous solution. The surface tension/energy is defined herein as the energy required to break or disrupt the surface of a solution. A high surface tension tends to restrain a liquid from flowing or wetting an adjacent liquid or solid substrate. Typically DuNuoy ring tensiometers or Wilhelmy plate tensiometers are used to measure surface tensions of solutions.

In another aspect, the present invention comprises an organic hydraulic fluid comprising, one or more phosphate esters, a bis(perfluoroalkanesulfonyl)imide salt additive and optionally other adjuvants or components added for optimal hydraulic fluid performance such as viscosity index improvers, acid control components, antioxidants, lubricants, dyes, corrosion inhibitors, antifoamers and the like, and mixtures thereof.

Surface Active Agents

The surface active agents (or surfactants) or additives of the present invention include bis(perfluoroalkanesulfonyl) imides and their salts. These imides can be represented by the following formula:

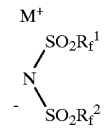

where $R_f^1$ and $R_f^2$ are independently a perfluoroalkyl group containing from 1 to 12 carbon atoms, optionally containing catenated heteroatoms such as O, N, within the carbon chain. Preferably, $R_f^1$ and $R_f^2$ contain from 2 to 6 carbon atoms and more preferably contain from 3 to 5 carbon atoms for more rapid environmental bioelimination. M is H or an inorganic or organic cation.

Bis(perfluorobutanesulfonyl)imide is particularly suited for these applications.

Bis(perfluoroalkanesulfonyl)imides and their salts may be prepared from perfluoroalkanesulfonyl halides by methods which are well known in the art and described in U.S. Pat. Nos. 5,874,616, 5,723,664, and ZA 9804155. Generally, these anions can be prepared by reacting $2R_fSO_2X$ with $NH_3$ in the presence of $Et_3N$ (or a similar base) or by reacting $R_fSO_2X$ with $R_fSO_2NH_2$ in the presence of $Et_3N$ (or a similar base).

These surfactants/additives may comprise a wide variety of metallic and nonmetallic cations including, but not limited to, any alkali metal cations, any alkaline earth metal cations, (for example, $Li^+$, $K^+$, $Na^+$, $Ca^{2+}$, $Mg^{2+}$), $H^+$, $H_3O^+$, $NH_4^+$, $Zn^{2+}$, $Cu^{2+}$ and various organo-nitrogen, organo-ethers, and phosphorous onium cations (e.g., protonated forms of JEFFAMINE™ Polyalkylene Amines, available from Huntsman Corporation, Salt Lake City, Utah, and ETHOQUAD™, available from Akzo Nobel Surface Chemisity LLC., Chicago, Ill.

In an aqueous solution, suitable surfactants include, but are not limited to, salts having combinations of the cations $H^+$, $NH_4^+$, $H_3O^+$, $Na^+$, $K^+$, $Li^+$, $Mg^{2+}$, $Ca^{2+}$, $Zn^{2+}$, $Cu^{2+}$ and various ammonium cations derived from protonation of commercially available JEFFAMINE™ Polyalkylene Amines with any of the anions shown below:

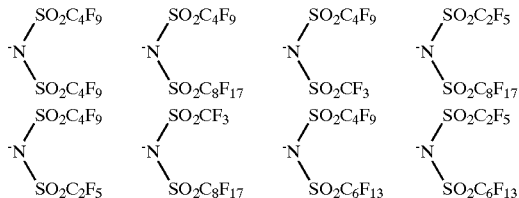

In a nonaqueous, or a hydraulic fluid solution, suitable additives include, but are not limited to, salts having combinations of the cations $Na^+$, $K^+$, $Mg^{2+}$, $Ca^{2+}$, $Me_4N^+$, $Bu_4N^+$, $Bu_4P^+$, 1,3-ethylmethylimidazolium, and N-butylpyridinium with any one of the anions shown below:

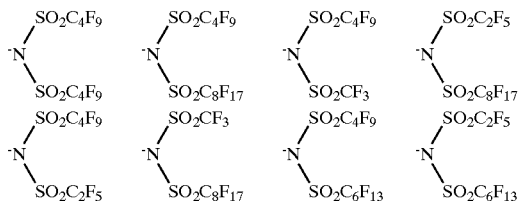

Based on the art, one skilled in the art would expect that surfactants (surface active agents) or additives derived from a shorter fluorochemical chain could not be as effective as ones derived from a longer fluorochemical chain. Even in hydrocarbon surfactants, increasing the chain length of the hydrocarbon chain, decreases the CMC (critical micelle concentration). The decrease in CMC is roughly one order of magnitude for each —$CH_2CH_2$— added to the chain (*Amphoteric Surfactants*, edited by Eric G. Lomax, Marcel Dekker Inc. (1996), p. 13). The same trend has been noted in surfactants derived from the perfluorocarboxylic acids and the sulfonic acids (*Organofluorine Chemicals and their Industrial Applications*, edited by R. E. Banks, Ellis Horwood Ltd. (1979), p. 56; J. O. Hendrichs, *Ind. Eng Chem*, 45, 1953, p. 103; M. K. Bernett and W. A. Zisman, *J. Phys. Chem.*, 63, 1959, p. 1912. Because models to explain the actions of surfactants often invoke the monolayer of the surfactant on the air/liquid interface, one would expect the same to be true of fluorinated surfactants, and that activity of the surfactant would be closely tied to its chain length. So, for example in FIG. 1, which depicts the surface tension versus concentration profiles for the potassium salts of perfluorobutanesulfonate and perfluorooctanesulfonate (PFOS), perfluorobutanesulfonate is less effective than perfluorooctanesulfonate in lowering the surface tension of water.

Figure 5:
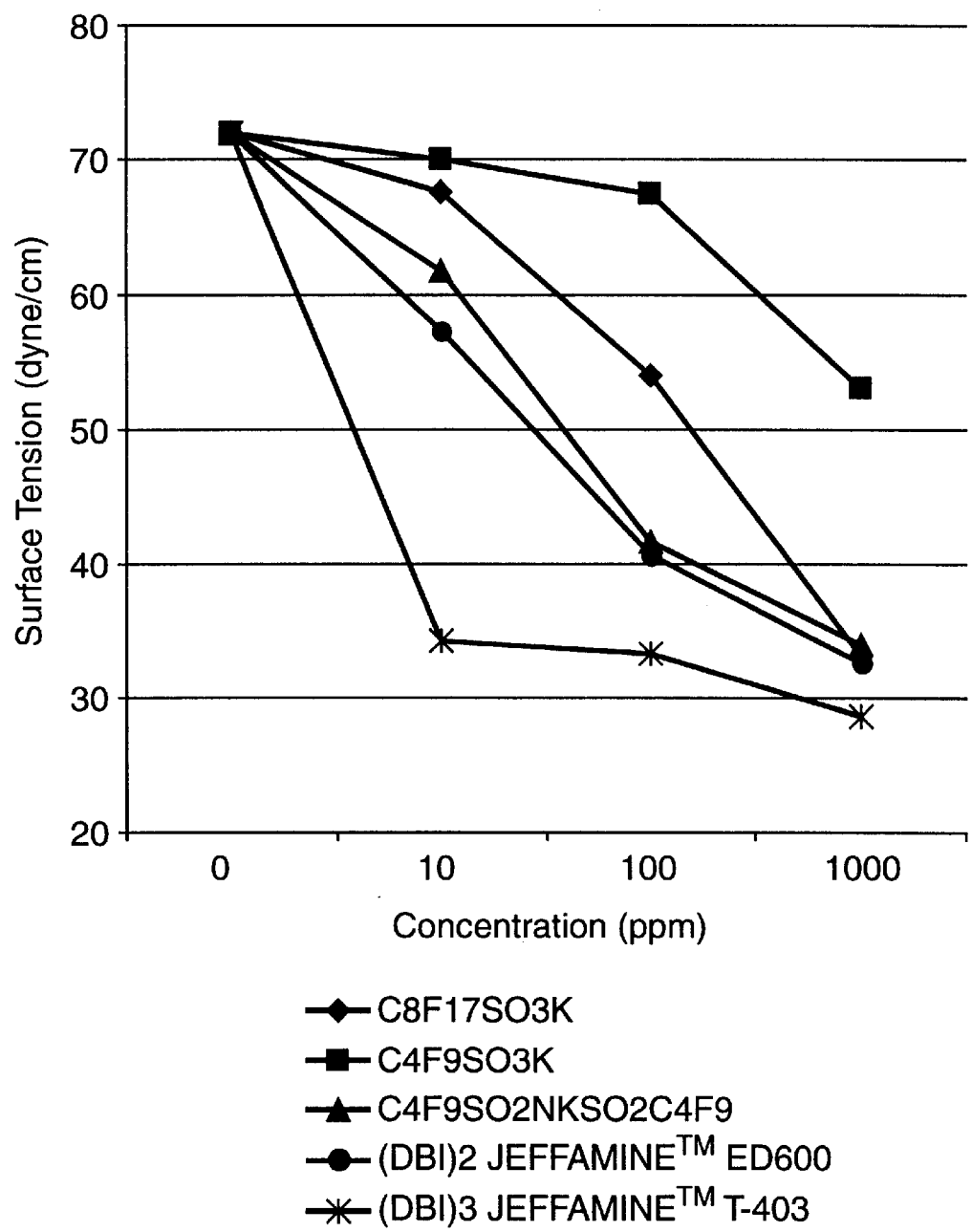
FIG. 5 is a graph of the surface tension versus concentration profiles of two JEFFAMINE™ salts of bis (perfluorobutanesulfonyl)imide and the potassium salts of bis(perfluorobutanesulfonyl)imide and the perfluoroalkanesulfonates.

Expectations from the art were that the shape of the molecule would also impact its ability to act as a surface-active agent. Zisman and others have found that with long chain carboxylic acid monolayers on metal plates, the straight chain materials give lower surface energies than the branched analogs. The idealized model of how surfactants work in solutions is believed to be represented by the monolayer of polar molecules oriented on a metal surface. Based on this information, the branched material, potassium bis(perfluorobutanesulfonyl)imide, is predicted to exhibit higher surface tension values than potassium perfluorobutanesulfonate (PBSK). FIG. 5, however, demonstrates that potassium bis(perfluorobutanesulfonyl)imide exhibits surface tensions significantly less than PBSK and comparable to potassium perfluorooctanesulfonate at equal concentrations.

In addition, it is particularly advantageous to use perflurobutanesulfonyl fluoride (PBSF) as a surfactant precursor as opposed to POSF because of the higher yield of perflurobutanesulfonyl fluoride (58%) in electrochemical fluorination over perfluorooctanesulfonyl fluoride (31%) (*Preparation, Properties, and Industrial Applications of Organofluorine Compounds*, edited by R. E. Banks, Ellis Horwood Ltd (1982), p.37). Thus, PBSF derived surfactants can be produced at a lower cost per unit weight because of their higher yields and still maintain their potency as surfactants at the same weight percent.

Figure 2:
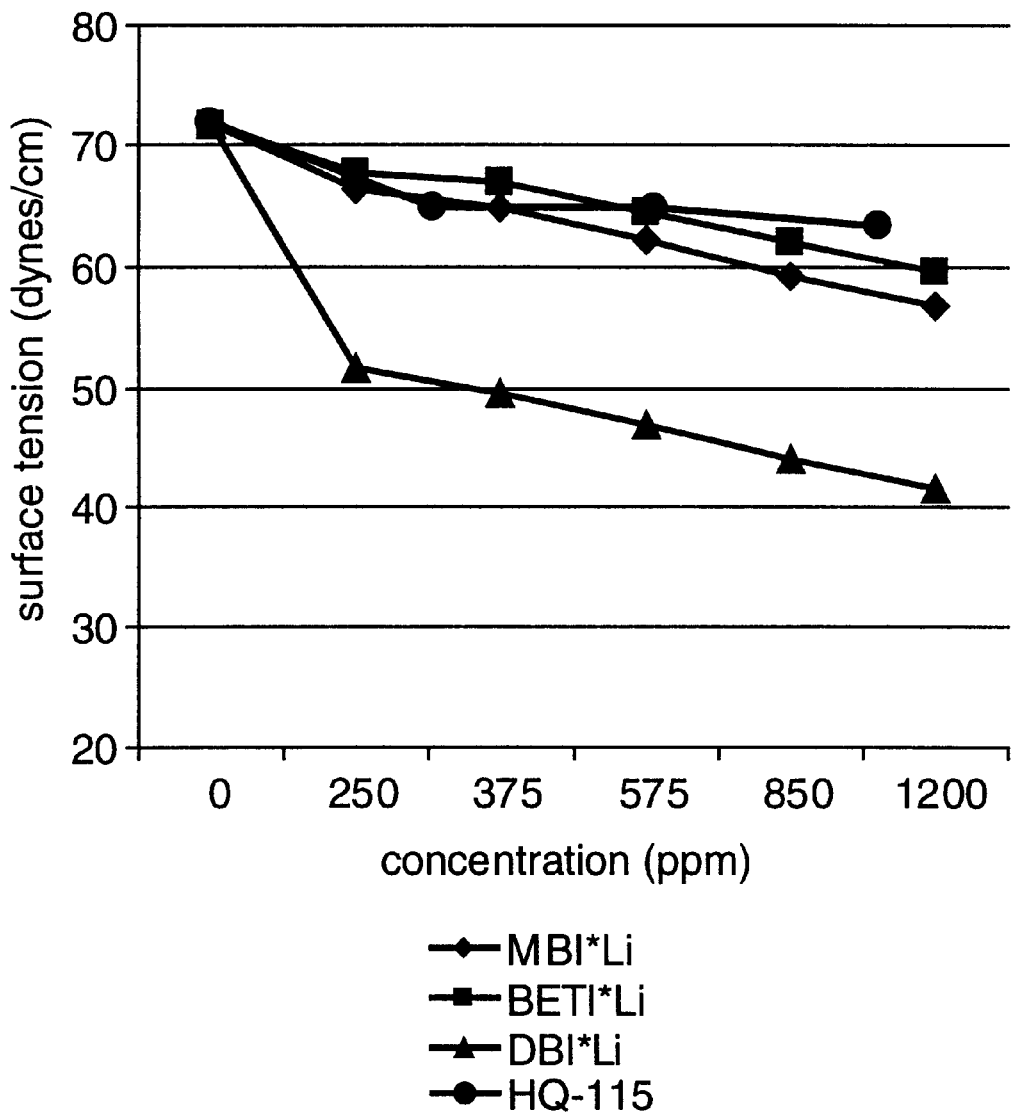
FIG. 2 is a graph of the surface tension (dyne/centimeter) versus concentration (ppm) profile of a series of lithium salts of the imides in water.

Bis(perfluorobutanesulfonyl)imides and their salts are superior to the other lower homologues of the imide series as far as their surfactant properties are concerned. This is shown in FIG. 2 where the surface tension (dynes/cm) versus concentration (ppm) profile of a series of Li salts of the imides in water is plotted. In FIG. 2, MBI is $[C_4F_9SO_2N(-)SO_2CF_3]Li$, BETI-Li is $C_2F_5SO_2N(-)SO2C_2F_5]Li$, and HQ-115 is $Li^{+-}N(SO_2CF_3)_2$, available from Minnesota Mining and Manufacturing Company, St. Paul, Minn. Lithium bis(perfluorobutanesulfonyl)imide exhibits significantly lower surface tensions than the shorter chain homologues, MBI-Li, BETI-Li, and HQ-115, confirming that an increase in chain length significantly contributes to lower surface tensions.

Figure 3:
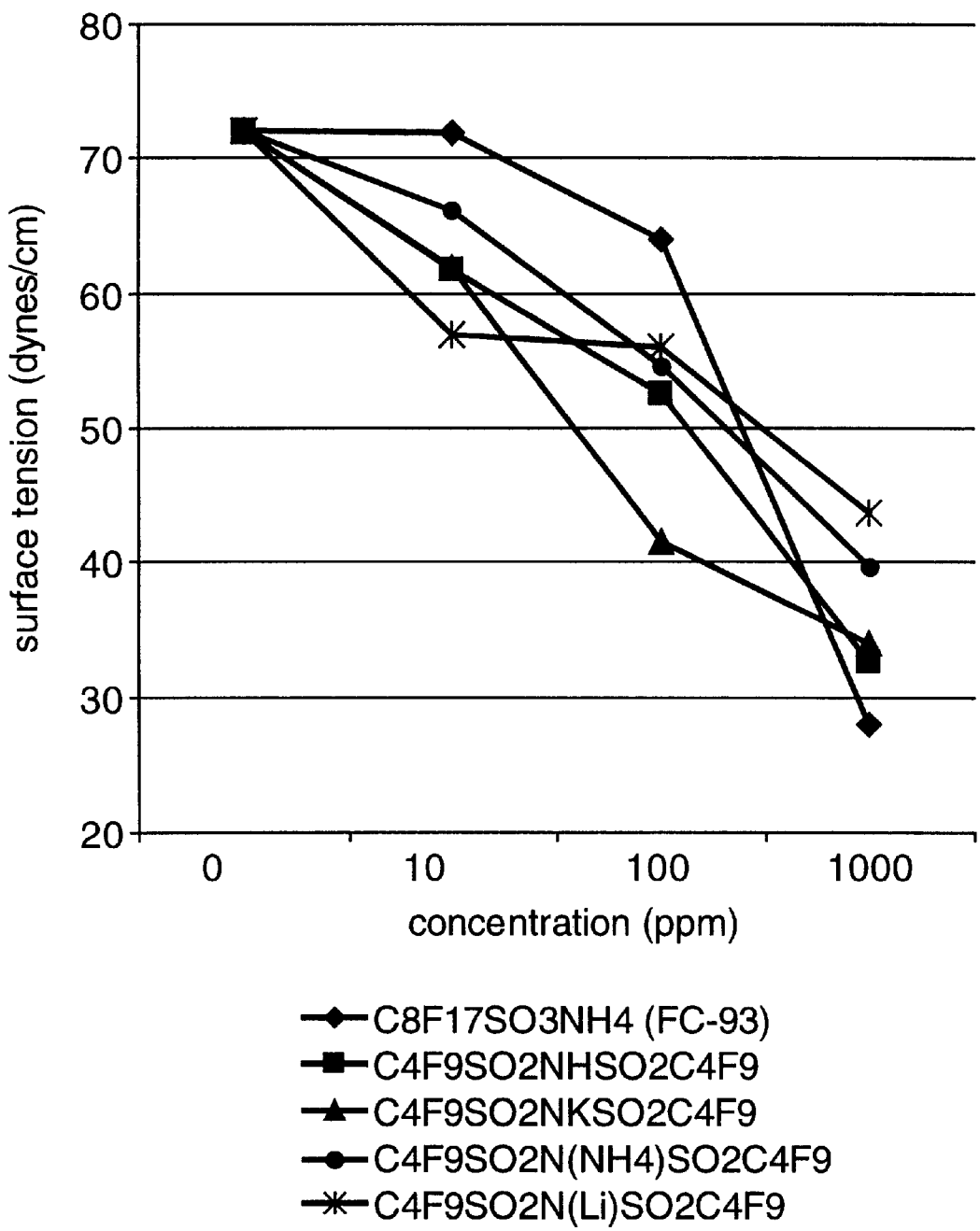
FIG. 3 is a graph of the surface tension (dyne/centimeter) versus concentration (ppm) profile of both ammonium perfluoro-octanesulfonate (II, FC-93, available from Minnesota Mining and Manufacturing Company, St. Paul, Minn.), the acid form of bis(perfluorobutanesulfonyl)imide (that when dissolved in water actually exists as a bis (perfluorobutanesulfonyl)imide anion with protonated water ($H_3O^+$) as the counterion), and its salts with $NH_4^+$, $Li^+$, and $K^+$.

FIG. 3 shows the surface tension (dynes/cm) versus concentration (ppm) profile of ammonium perfluorooctanesulfonate (II, FC-93) versus the acid form of bis (perfluorobutanesulfonyl)imide (which in water, actually exists as the hydronium ion salt $H_3O^{+-}N(SO_2C_4F_9)_2$), as well as the $NH_4^+$, $Li^+$, and $K^+$ salts of bis (perfluorobutanesulfonyl)imide.

In FIG. 3, the non-metallic salts of bis (perfluorobutanesulfonyl)imide such as $H_3O^{+-}N(SO_2C_4F_9)_2$ and $NH_4^{+-}N(SO_2C_4F_9)_2$ are better surfactants than $NH_4^{+-}OSO_2C_8F_{17}$ (FC-93, available from Minnesota Mining and Manufacturing Company, St. Paul, Minn.) at concentrations up to 1000 ppm. Recommended use levels for FC-93 are 100–1000 ppm in water (Technical Service Bulletin FLUO-RAD™ Etching Bath Additive FC-93, Issued 10/90).

Figure 4:
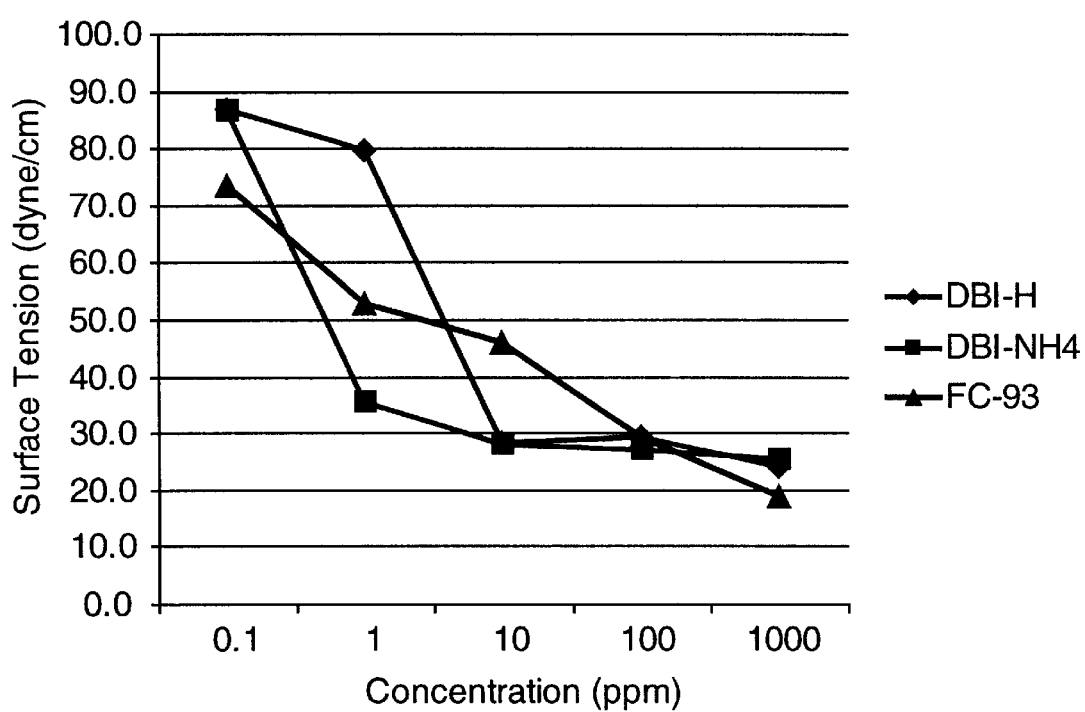
FIG. 4 is a graph of surface tension versus concentration in the 10/1 buffered oxide etch solution for the acid form of bis(perfluorobutanesulfonyl)imide and it's ammonium salt, along with a control (FC-93).

FIG. 4 is a graph of surface tension (dynes/cm) versus concentration (ppm) in a 10/1 buffered oxide etch solution for the acid form of bis(perfluorobutanesulfonyl)imide and its ammonium ($NH_4^+$) salt. A control of FC-93 is included in the graph, but at all concentrations the FC-93 precipitated. The bis(perfluorobutanesulfonyl)imide and its salts in contrast were soluble at all the concentrations. The 1000 ppm solutions of bis(perfluorobutanesulfonyl)imide were slightly hazy to the eye.

The protonated JEFFAMINE™ salts of bis (perfluorobutanesulfonyl)imide (($DBI)_2$ JEFFAMINE™ ED-600 and $(DBI)_3$T-403) function as a surfactant. In FIG. 5, the surface energies (dynes/cm) versus concentration (ppm) profiles of two JEFFAMINE™ salts of bis (perfluorobutanesulfonyl)imide, in water, are shown and compared with the potassium salts of the perfluoroalkanesulfonates. Both of the JEFFAMINE™ salts produce significantly lower surface tensions than $C_4F_9SO_3K$. $(DBI)_3$ JEFFAMINE™ T-403 exhibits significantly lower surface tensions than all of the potassium salts in FIG. 5 ($C_8F_{17}SO_3K$, $C_4F_9SO_3K$, $C_4F_9SO_2NKSO_2C_4F_9$) and $(DBI)_2$ JEFFAMINE™.

The surfactants or additives of the present invention are typically added to solution, in the range of 10 to 50,000 ppm, preferably 10 to 5000 ppm.

Applications

Applications having an extreme environment that comprises an aqueous solution include, but are not limited to, etching solutions used in the preparation of semi-conductor devices, photo-resist development and stripping solutions, electrochemical plating and polishing solutions, wafer cleaning and polishing (chemical/mechanical or chemical) solutions, and anisotropic etching solutions. Each of these applications uses an aqueous solution that would degrade many hydrocarbon surfactants. For use in semiconductor processing, a surfactant must not contain metallic counter-ions. Alkali metals are referred to as mobile contaminants. Their presence causes shifts in the threshold voltage and flatband voltage of semiconductors. This could sufficiently alter the electronic properties of the semiconductor to potentially cause shorts in the device. (D. C. Burkman, C. A. Peterson, L. A. Zazzera, and R. J. Kopp, *Microcontamination*, November, 1988). Therefore, typically ammonium salts are used.

Silicon dioxide etching with aqueous HF solutions is used to clean silicon wafers or to pattern oxide films on silicon wafers. During etching, poor wetting of the wafer surface by the acid etchant can result in air entrapment in the form of small bubbles. These bubbles can result in bridging over of the fine openings in the patterned surface, potentially creating electrical shorts in the device. Thus, a stable surface active agent is desirable that lowers the surface tension of the etching solutions used in the preparation of semi-conductor devices, and that allows uniform wetting and etching without air entrapment.

Either aqueous hydrogen fluoride (HF) or a buffered Oxide Etch (BOE) solution can be used to pattern oxide films by removing the areas of silicon dioxide unprotected by photoresist (i.e., a photoactive film) and thus exposing the silicon underneath. A typical BOE is 1 part 49% HF and 7 parts 40% ammonium fluoride. The BOE does not attack the photoresist. Silicon surfaces have a lower surface energy than a silicon dioxide surface. Therefore, aqueous media do not wet the exposed silicon as well as the silicon dioxide. Thus, a surfactant is desirable to aid in wetting the exposed silicon. Stability of the hydrocarbon surfactants in the HF solution used for etching is an issue. Often less stable hydrocarbon surfactants degrade to insoluble fragments that are filtered out in the continuously filtering etch bath. The consequent rise in surface tension can occur rapidly with its attendant higher rejection rates (K. M. Shah, P. Mikkelson, W. Cummings, Semiconductor International, October, 1988).

A relatively low concentration (10–1000 ppm) of fluorinated surfactant is added to the aqueous HF and BOE solutions to lower the surface tension of the solution and improve wetting. Thus, the efficiency of the wafer cleaning or oxide patterning process is enhanced. The net results are extended life of the etch bath due to the stability of the surface active agent and reduced defect rates (higher defect rates are the result of air entrapment).

Photolithography is a process that produces a miniature image of a circuit on a silicon wafer. A photoactive film also known as photoresist or "resist" is applied to a silicon wafer to create a thin uniform film. This process is typically performed by spin coating the photoactive film. The photoactive film is then soft baked (mild heating in an oven) to drive off the coating solvents. The photoactive film is subsequently exposed to light energy projected through a patterned mask, to define a circuit or component pattern on the silicon wafer, read-write head, or other device. In a positive photoresist the light initiates a photo-reaction with a photo-acid generator producing acid, which in turn catalyzes a chemical transformation within the photoresist thereby increasing its solubility in the developer. A developer solution comprising aqueous base (e.g., tetra methyl ammonium hydroxide, TMAH) then selectively removes the lower molecular weight material and forms the desired image in the photoresist.

In some cases, manufacturing yields of microelectronic devices will decrease because the vertical walls of the photoresist pattern collapse. The high surface tension of the aqueous developer solutions can be an important contributor to the collapse of the photoresist walls in the imaged areas. Aqueous developer solutions containing a relatively low concentration (10–1000 ppm) of the fluorinated surfactants of the present invention can reduce surface tension and minimize pattern collapse as well as minimize line edge roughness (LER), while providing stability under conditions of high pH.

The surfactants and additives of the present invention are particularly useful for electrochemical plating and polishing of metal films such as copper. Copper has been identified as a preferred interconnect material for high performance microprocessor chips because of its low electrical resistivity. The transition in manufacturing to copper dual damascene requires strict control of plating and polishing of copper. Electroplating is a preferred method for copper interconnect deposition in the manufacture of integrated circuits because of its trench filling capacity and of its relatively low cost. Copper electroplating from acidified copper sulfate is the most popular plating chemistry due to its stability and its low cost.

Aqueous acid copper plating solutions generally consist of three main components: 1) copper sulfate (the source of copper and is typically in the range of 0.2–0.6 M), 2) sulfuric acid which provides conductivity to the electrolyte (typically in the range of 1–2 M), and 3) various additives, including surfactants, that are typically in the 10–10,000 ppm range.

Chemical mechanical polishing (CMP) is used to planarize copper interconnects in the manufacture of integrated circuits because of its relatively low cost and because copper is difficult to etch using a dry plasma. A copper CMP slurry is composed of abrasive particles, oxidants, etchants, and corrosion inhibitors. Alumina based slurry in acidic solution is widely used in copper CMP. Additives are critical for the strict control required during the plating and polishing of copper. The surfactants and additives of the present invention may be used in relatively low concentrations (10–1000 ppm) in aqueous plating and polishing solutions to lower the surface tension of the solution and to improve wetting which enhances the rate and the uniformity of the plating and polishing action. The inventive surfactants and additives further provide the stability required to survive the harsh conditions typically employed in these processes, including low pH, corrosive reagents, and both reducing and oxidizing electrochemical potentials.

The most common processing step of semiconductor chip manufacture is wafer cleaning. During wafer cleaning, oxidative cleaning steps are used to oxidize the silicon surface and to oxidize, dissolve, and remove organic contaminants. Typically, the wafer is contacted with aqueous mixtures of $H_2O_2$ or $O_3$, $H_2SO_4$, $NH_4OH$ or HCl. Etch cleaning steps remove native and deposited silicon oxide films from the silicon surface by contacting the wafer with dilute aqueous HF. Other important oxidative and etch cleaning processes in semiconductor chip manufacture include the removal of residues left behind from plasma ashing or etching of dielectric, photoresist or metals and post CMP cleaning to remove silicon oxide residues after oxide polish.

The wafer cleaning and polishing solutions may contain relatively low concentrations (10–1000 ppm) of fluorinated surfactant of the present invention to lower the surface tension of the solution and improve wetting. Therefore, the rate and the uniformity of the cleaning and polishing action is enhanced. Unlike most hydrocarbon-based surfactants, the fluorinated surfactants of the present invention are stable to the highly corrosive and acidic or basic reagents used in these wafer cleaning and polishing applications.

Anisotropic etching of single crystal silicon is used to fabricate trenches, channels, membranes, and diffraction gratings for integrated circuit, optical, and microelectromechanical devices. Anisotropy results because the reaction rate in the Si(100) plane is approximately 75 times faster than in the Si(111) plane. Anisotropic etching produces V-shaped grooves with side walls 54 degrees from the Si(100) surface. Etch solutions for the anisotropic etch process are generally aqueous alkaline solutions based on sodium or potassium hydroxide, quaternary ammonium hydroxides, ethylenediamine, or ethanolamine. The etch solutions may contain a relatively low concentration (10–1000 ppm) of fluorinated surfactant of the present invention to lower the surface tension of the solution and improve wetting, therefore enhancing the rate and the uniformity of the anisotropic etching action while providing stability under harsh conditions.

The potassium salt of bis(perfluorobutanesulfonyl)imide may be used in extreme applications where the presence of the potassium ion is not of concern such as chrome plating baths, conversion coatings and metal and plastic etchants. As can be seen in FIG. 5, potassium bis (perfluorobutanesulfonyl)imide has the same or better surface tension in water as $C_8F_{17}SO_3K$ (FC-95, available from Minnesota Mining and Manufacturing Company, St. Paul, Minn.), through it's typical use range (10–1000 ppm).

Hydraulic Fluid

The surfactants or additives of the present invention can also be used in organic solutions such as hydraulic fluids that have an extreme environment. Suitable additives of the present invention are soluble in the base hydraulic fluid, surface active, and possess the requisite conductivity.

The potassium salts of perfluorooctanesulfonate or perfluoroethylcyclohexanesulfonate have been shown to be useful as erosion inhibitors when dissolved in aircraft hydraulic fluids such as phosphate esters (e.g., SKYDROLS™, available from Solutia, St. Louis, Mo.).

The hydraulic fluids of the present invention comprise liquid phosphate esters, and mixtures thereof, wherein the phosphate esters are represented by the formula:

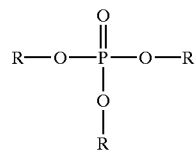

wherein, each R is individually an alkyl or an alkoxyalkyl group containing from 2 to 12 carbon atoms, phenyl groups and substituted phenyl groups containing up to 20 carbon atoms, wherein the substituents are alkyl, phenyl, or phenyl alkyl, and wherein the alkyl groups contain from 1 to 10 carbon atoms.

The hydraulic fluids comprise at least 50+% by weight of the phosphate ester. Preferably, the phosphate ester comprises from 65 to 99.999 percent by weight of the hydraulic fluid. The hydraulic fluids of this invention can also contain other lubricants, for example, polyesters, polyphenyl ethers, and the like.

The amount of the additive employed in the hydraulic fluid compositions of this invention is from as little as 0.001 to as much as 5.0 parts additive per 100 parts of the phosphate ester. Amounts greater than 5.0 parts can be employed if soluble in the hydraulic fluid.

Typically, potassium perfluoroethylcyclohexanesulfonate (FC-98, available from Minnesota Mining and Manufacturing Company, St. Paul, Minn.) is used commercially because of its better conductivity, improved solubility, and acceptable surface activity in phosphate esters used in commercial formulations of aircraft hydraulic fluids. In these applications, a conductivity enhancing additive is desirable for electrochemical erosion control (See e.g., WO 00/24848). The potassium salt of bis (perfluorobutanesulfonyl)imide has sufficient solubility in phosphate ester to function as an anti-erosion additive and provides high conductivity. Potassium bis (perfluorobutanesulfonyl)imide dissolves in SKYDROL™ LD-4 (a commercial aircraft hydraulic fluid manufactured by Solutia, St. Louis, Mo.) at up to 2 weight %.

Other adjuvants may be added to the phosphate ester such as, but not limited to, viscosity index improvers, acid control components, antioxidants, lubricants, dyes, corrosion inhibitors, antifoamers and the like.

A viscosity index improver is typically employed in the hydraulic fluids of the present invention in an amount effective to reduce the effect of temperature on the viscosity of the hydraulic fluid (typically about 2 to about 10 weight percent). Examples of suitable viscosity index improvers are disclosed, for example, in U.S. Pat. No. 5,464,551 and U.S. Pat. No. 3,718,596, which are incorporated herein by reference. Preferred viscosity index improvers include poly(alkyl acrylate) and poly(alkyl methacrylate) esters of the type disclosed in U.S. Pat. No. 3,718,596, and that are commercially available from Rohm & Haas, Philadelphia, Pa.

Typically, the hydraulic fluids of the present invention further comprise an acid control component or an acid scavenger in an amount effective (typically about 4 to about 10 weight percent) to neutralize acids formed in the hydraulic fluid, such as phosphoric acid and its partial esters. Suitable acid control components are described, for example, in U.S. Pat. No. 5,464,551; U.S. Pat. No. 3,723, 320; and U.S. Pat. No. 4,206,067, which are incorporated herein by reference.

In another embodiment, the hydraulic fluids of this invention further comprise an antioxidant or mixture of antioxidants in an amount effective to inhibit oxidation of the hydraulic fluid or any of its components (typically about 0.5 to about 3 weight percent). Suitable antioxidants are described in U.S. Pat. No. 5,464,551, which is incorporated herein by reference, and other hydraulic fluid patents and publications.

In yet another embodiment, the hydraulic fluids of this invention further comprise lubricants, dyes, corrosion inhibitors, antifoamers and other adjuvants or mixtures thereof to further improve the performance of the hydraulic fluid.

EXAMPLES

The present invention will be further described with reference to the following. non-limiting examples and test methods. All parts, percentages, and ratios are by weight unless otherwise specified.

TEST PROCEDURES

Test Procedure I—Surface Tension Determination

All surface tensions were determined using a Kruss K12 Tensiometer. The tensiometer was integrated with an automatic dosimat and a computer, using a software package for dynamic contact angle (K121). The program was run using a Wilhelmy platinum plate (PL12) and glass sample vessel (GL7). All parts referenced above including instrument and computer are available from Kruss USA, Charlotte, N.C.

The comparative salts were prepared as follows:

Potassium perfluorobutanesulfonate (PBSK) FR2025 is available from Minnesota Mining and Manufacturing Company, St. Paul, Minn.

Potassium perfluorooctanesulfonate was prepared essentially according to U.S. Pat. No. 2,732,398, Example 5, with the exception that $CH_3(CH_2)_7SO_2Cl$ is replaced with $CH_3(CH_2)_7SO_2F$ as the starting material.

Potassium perfluoroethylcyclohexanesulfonate (FC-98) was prepared by electrochemical fluorination of p—$C_2H_5$—$C_6H_4$—$SO_2F$ in anhydrous HF to produce $C_2F_5$—$C_6F_{10}$—$SO_2F$ followed by hydrolysis with aqueous $K_2CO_3$ as in U.S. Pat. No. 2,732,398.

Example 1

Synthesis of $(C_2H_5)_3NH^+$$^-N(SO_2C_4F_9)_2$

An oven-dried, 600 mL Parr reactor constructed of Hastalloy and Monel and equipped with a Magnetron stirrer, Parr 4843 controller (Parr Instrument Company, Moline, Ill.), a needle valve for gaseous $NH_3$ addition, a dip tube for liquid product removal, 600 psi (4.1 MPa) pressure gauge, thermocouple probe and a heating mantle was vacuum charged with 187.2 grams anhydrous triethylamine and 362.5 grams high purity perfluorobutanesulfonylfluoride, (available from Aldrich Chemical Company, Milwaukee, Wis.). The reactor body was then chilled in a dry ice bath to approximately −20° C. Once cool, the reactor was charged with 9.0 grams anhydrous ammonia gas, introduced through a needle valve attached to the reactor head assembly to allow precise gas metering from the gas cylinder mounted on an adjacent balance. Once all the ammonia was added, the reactor was mounted in its stand with a heating mantle, stirring was begun at full speed (700 RPM) and the reactor temperature was rapidly ramped to 90° C. A maximum pressure of 100 psi (690 kPa) was reached at approximately 20° C. during the temperature ramp. Increasing the reactor temperature beyond 40° C. resulted in a rapid drop in pressure as $NH_3$ was rapidly consumed. Once the set-point temperature of 90° C. was reached, the temperature was held at this value for 19 hours (overnight). At the end of the heating cycle, residual $C_4F_9SO_2F$ and triethylamine were removed by vacuum stripping for approximately one hour at 90° C., 40 torr through the gas port in the reactor head while stirring. Volatiles were collected in a dry ice trap. The reactor was then allowed to cool to near room temperature and the crude product collected in a polyethylene bottle by pressurizing the reactor with about 10 psi (69 kPa) nitrogen and forcing the liquid contents out the dip tube. Without disassembling or cleaning the reactor, this exact procedure was repeated a second time to generate a second batch of crude product. The combined crude product collected from batches 1 and 2 totaled 976.9 grams. Although liquid initially, the crude product partially solidifies upon standing for long periods at room temperature.

A total of 975 grams of material was melted in the oven at 50° C. and was washed in a flask with 1800 grams of water at 44° C. The top water phase was removed using a TEFLON™ tube at the end of a black rubber hose attached to an aspirator, and the bottom dark brown fluorochemical phase was washed again with 1800 ml water at 57° C., then allowed to cool to 17° C. at which point the stirring was stopped and the material solidified. The top water layer was then removed using a TEFLON™ tube at the end of a black rubber hose attached to an aspirator. The brown fluorochemical phase was washed with water three more times as described above. A total of 744 grams of liquid $(C_2H_5)_3NH^+$$^-N(SO_2C_4F_9)_2$ was poured out of the flask at 77° C. and weighed.

Example 2

Synthesis of $HN(SO_2C_4F_9)_2$

The water-washed $(C_2H_5)_3NH^+$ salt, above was placed back in a flask and the material was heated at 10 mm Hg (1.3 kPa) vacuum at 77° C. for one hour to remove the dissolved water (49 grams). At this time the vacuum was broken, and 419 grams of 94–96% sulfuric acid was added to the dried $(C_2H_5)_3NH^+$ $^-N(SO_2C_4F_9)_2$ with stirring. The temperature increased to 93° C. The acidic material was distilled from the sulfuric acid at 4 mm to give 551 grams of $HN(SO_2C_4F_9)_2$ that distilled at 110–125° C. Water analysis revealed the product contained 4 weight % water.

Example 3

Synthesis of $NH_4^+$$^-N(SO_2C_4F_9)_2$

A total of 174 grams of $HN(SO_2C_4F_9)_2$ from Example 2 was dissolved in 1540 grams of water. The pH of the solution was in the range of 0 to 1. A total of 17 grams of 30% ammonium hydroxide was added with stirring. The pH of the solution remained in the range of 0 to 1. An additional 6.7 grams of 30% ammonium hydroxide was added and the pH was found to be 7 to 8. This batch was heated to 40° C. and nitrogen was purged through the solution for 2 hours. At that time the flask was cooled to room temperature and poured into a plastic bottle. A total of 1738 grams of $NH_4^+$$^-N(SO_2C_4F_9)_2$ solution was isolated and found to be 9.8% solids.

Example 4

Synthesis of $K^+$$^-N(SO_2C_4F_9)_2$

A total of 58.6 grams of $HN(SO_2C_4F_9)_2$ from Example 2 was dissolved in 250 grams of water. The pH of the solution was in the range of 0 to 1. A total of 6.9 grams of potassium carbonate was added with stirring. The batch was then heated 58° C. for 2 hours. The pH was measured to be about 6. At that time the flask was cooled to room temperature. The white solid in the flask was filtered and washed twice with 75 ml of water. After drying in the oven, a total of 47 grams of $K^{+-}N(SO_2C_4F_9)_2$ was isolated. The white solid remaining in the flask was washed out with repeated water washings and dried to give another 9.6 of $K^{+-}N(SO_2C_4F_9)_2$.

Example 5

Synthesis of $[^-N(SO_2C_4F_9)_2]_2(+)H_3NCH(CH_3)CH_2$ $[OCH(CH_3)CH_2]_a[OCH2CH2]_{8.5}[OCH(CH_3)CH_2]$ $_cNH_3(+)(a+c=2.5)$ A total of 760 grams (MW=581, 1.26 moles, as prepared in Example 2) of $HN(SO_2C_4F_9)_2$ which was 96% active and 4% water, was dissolved in 760 grams of hplc grade water in a 3 liter flask fitted with and overhead stirrer, themocouple, and addition funnel. While stirring, 398 grams of JEFFAMINE™ XJT-500 (MW 600, 0.66 moles), available from Huntsman Corporation, Salt Lake City, Utah, was added to the batch at 70° C. over a 30 minute period. The batch was stirred for an additional 15 minutes and the pH was measured to be in the range of 7 to 8. The batch set point was set at 70° C. and fitted with an overhead distillation apparatus. Vacuum was slowly pulled down on the batch via the receiver. The receiver had been precooled to −78° C. Water was stripped to the receiver until the vacuum reached 13 mm Hg (1.7 kPa). The batch was held at 70° C. and 13 mm Hg (1.7 kPa) for an hour. The amber honey-like liquid was poured out into jars and weighed. A total of 1042 grams of material was isolated.

Table 1 details the surface energy versus concentration profile for this material along with comparative perfluroalkanesulfonate materials (DBI)2 JEFFAMINE™ ED600.

Example 6

Synthesis of $CH^3CH_2C[CH_2(OCH_2CH(CH_3))$ $_xNH_3^+][CH_2(OCH_2CH(CH_3))_yNH_3^+][CH_2(OCH_2CH (CH_3))_zNH_3^{+}]$ $[^-N(SO_2C_4F_9)_2]_3$ where (x+y+z=5.3)

A total of 100 grams (MW=581, 0.165 moles) of $HN(SO_2C_4F_9)_2$ which was 96% active and 4% water, was dissolved in 175 grams of methyl t-butyl ether in a 1 liter flask fitted with and overhead stirrer, thermocouple, and addition funnel. While stirring 49 grams of JEFFAMINE™ T-403 (MW 440, 0.11 moles), available from Huntsman Corporation, Salt Lake City, Utah, was added to the batch at 70° C. over a 30 minute period. The batch was stirred for an additional 15 minutes and the pH was measured to be in the range of 7 to 8. The batch set point was set at 70° C. and fitted with an overhead distillation apparatus. The methyl t-butyl ether was stripped at atmospheric pressure until the pot temperature reached 80° C. Residual solvent and water were stripped to the receiver until the vacuum reached 13 mm Hg (1.7 kPa). The batch was held at 70° C. and 13 mm Hg (1.7 kPa) for an hour. The amber very thick liquid was poured out into jars and weighed. A total of 116 grams of material was isolated.

Table 1 details the surface energy versus concentration profile for this material along with comparative perfluroalkanesulfonate materials (DBI)3T-403. FIG. 5 shown previously is the same data shown graphically.

TABLE 1

|  | 0 ppm | 10 ppm | 100 ppm | 1000 ppm |
| --- | --- | --- | --- | --- |
| $C_8F_{17}SO_3K$ - comparative | 72 | 67.68 | 54.09 | 33.17 |
| $C_4F_9SO_3K$ - comparative | 72 | 70 | 67.5 | 53 |
| $C_4F_9SO_2NKSO_2C_4F_9$ | 72 | 61.85 | 41.61 | 34.02 |
| (DBI)2 JEFFAMINE ™ ED600 | 72 | 57.4 | 40.7 | 32.7 |
| Example 6 | 72 | 34.3 | 33.4 | 28.6 |

Example 7

Synthesis of $Mg^{+2}[^-N(SO_2C_4F_9)_2]_2$

A total of 36 grams of $HN(SO_2C_4F_9)_2$ from Example 2 was dissolved in 36 grams of water. The pH of the solution was in the range of 0 to 1. A total of 2.4 grams of magnesium carbonate (Mallinckrodt, St. Louis, Mo.) was added with stirring. The pH was measured to be about 6. The flask was then cooled to room temperature. The white solid precipitate in the flask was filtered and washed out with repeated water washings and then oven dried to give 13.1 grams of the desired dry potassium salt. Results of surface tension measurements in the water (dyne/cm) are shown in Table 2.

TABLE 2

|  | 0 ppm | 200 ppm | 450 ppm | 960 ppm | 1300 ppm | 1700 ppm | 2600 ppm |
| --- | --- | --- | --- | --- | --- | --- | --- |
| Mg (DBI)2 | 71.0 | 46.6 | 40.2 | 35.0 | 32.0 | 29.0 | 26.3 |
| DBI-NH4 | 71.0 | 48.6 | 44.1 | 40.1 | 38.7 | 35.9 | 31.5 |
| DBI-Li | 71.0 | 53.2 | 48.1 | 42.8 | 41.5 | 39.1 | 36.0 |

Figure 6:
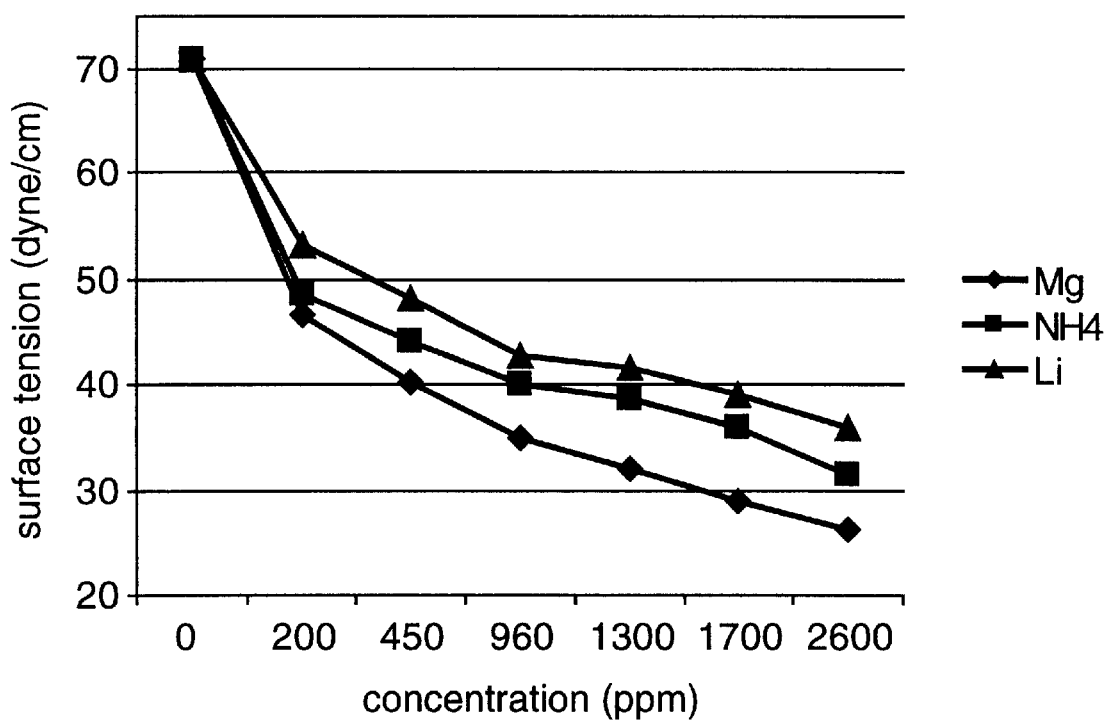
FIG. 6 is a graph of the surface tension (dyne/centimeter) versus concentration (ppm) for the $Mg^{2+}$, $Li^+$, and $NH_4^+$ salts of bis(perfluorobutanesulfonyl)imide.

FIG. 6 show the data graphically and compares it with the ammonium and lithium salts of DBI.

Example 8

Hydraulic Fluid

A hydraulic fluid (adopted from WO93/25641; Example 1) containing an anti-erosion agent of the present invention $(K[N(SO_2C_4F_9)_2])$ is prepared according to the composition described in Table 3.

TABLE 3

| Material | % | Availability |
| --- | --- | --- |
| Tributyl Phosphate | 49.0135 | Aldrich Chemical Co. Milwaukee, WI |
| Dibutyl phenyl phosphate | 26.34 | Exchange Chemical Inc Center Ossipee, NH |
| Methacylate Ester Viscosity Index Improver (PA6477, 45.3% solids in tributyl phosphate | 16.56 | Rohm & Haas, Philadelphia, PA |
| 3,4 Epoxycyclohexane Carboxylate | 6.3 | Described in U.S. Pat. No. 3,723,320 |
| $K[N(SO_2C_4F_9)_2]$ | 0.05 | Example 4 |
| Benzotriazole type Copper Corrosion Inhibitor P57068, 50% active EXI 663 | 0.05 | Baker Petrolite, Sugarland, TX |
| Iron Corrosion Inhibitor (90-31001 50% active) | 0.05 | Baker Petrolite, Sugarland, TX |
| Soluble Dye | 0.001 |  |

TABLE 3-continued

| Material | % | Availability |
|---|---|---|
| Potassium Phenoxide | 0.035 | Organomettalics, Inc East Hampstead, NH |
| Bis(3,5 di-tert-butyl-4-hydroxyphenyl) methane (Ethanox 702) | 0.90 | Albemarle Corporation, Baton Rouge, LA |
| Di(p-octylphenyl) amine (Vanlube ™ 81) | 0.45 | R. T. Vanderbilt, Norwalk, Connecticut |
| 2,6,-di-tert-butyl-4-methylphenol | 0.25 | Aldrich Chemical Co. Milwaukee, WI |
| Antifoam DC 200 | 0.0005 | Dow Corning, Midland, MI |

Example 9

Conductivity of Potassium salts in Tributylphosphate

This example illustrates the improved conductivity provided by potassium bis(perfluorobutanesulfonyl)imide versus the known art and erosion additives (PBSK and FC-98) when dissolved in a typical aircraft hydraulic base fluid, tributylphosphate.

Four tributylphosphate samples, with or without dissolved anti-erosion additives, measured for DC conductivity. The four samples were neat tributyl phosphate (control), tributyl phosphate with 3000 ppm FC-98, tributyl phosphate with 3000 ppm PBSK, and tributyl phosphate with 3000 ppm potassium bis(perfluorobutanesulfonyl)imide (DBIK).

Conductivity was measured using an Orion Model 122 DC Conductivity meter with 4-electrode conductivity probe (epoxy body, carbon electrodes, model 012210) with temperature sensing and compensation available from ThermoOrion, Beverly, Mass.

The conductivity probe was carefully cleaned with EM Science OMNISOLV™ grade methanol, dried in a clean nitrogen stream, and allowed to equilibrate back to ambient temperature between samples.

TABLE 4

| Sample | Observed Conductivity (uS/cm) |
|---|---|
| Tributyl Phosphate (control sample) | 0.1 uS/cm @ 21.6° C. |
| Tributyl Phosphate with 3000 ppm FC-98 comparative | 3.2 uS/cm @ 21.9° C. |
| Tributyl Phosphate with 3000 ppm PBSK comparative | 3.5 uS/cm @ 21.6° C. |

TABLE 4-continued

| Sample | Observed Conductivity (uS/cm) |
|---|---|
| Tributyl Phosphate with 3000 ppm DBIK | 13.8 uS/cm @ 21.7° C. |

When the conductivity of the same samples were measured by total AC impedance, the results were in agreement with these values.

Example 10

Surface tension measurements were obtained as described above with the exception that the measurements were obtained in tributyl phosphate.

TABLE 5

| Material | Surface Tension @ 2000 ppm (dyne/cm) |
|---|---|
| Tributyl Phosphate - comparative | 28.37 |
| $Mg(C_8F_{17}SO_3)_2$ - comparative | 27.36 |
| FC-98 - comparative | 26.94 |
| $K[N(SO_2C_4F_9)_2]$ | 27.34 |
| FC-95 - comparative | 26.96 |
| $Mg[N(SO_2C_4F_9)_2]_2$ | 27.04 |
| $Ca(C_8F_{17}SO_3)_2$ - comparative | 26.15 |
| $Mg(SO_3C_4F_9)_2 \cdot 6H_2O$ - comparative | 26.93 |
| $K(SO_3C_4F_9)$ - comparative | 27.32 |

Example 11

Bioelimination Study with Perfluorobutanesulfonate

Comparative study of potassium perfluorobutanesulfonate (using a dose level of 30 mg/kg body weight/day), potassium perfluorohexanesulfonate (using a dose level of 10 mg/kg body weight/day), and potassium perfluorooctanesulfonate (using a dose level of 3 mg/kg body weight/day). The amounts of fluorochemical sulfonate found in the male rat liver tissue samples are shown in Table 6.

TABLE 6

| | Amount (ppm) of Sulfonate | | | | | |
|---|---|---|---|---|---|---|
| Sulfonate | Day 1 | Day 1N* | Day 14 | Day 14N* | Day 28 | Day 28N* |
| $C_8F_{17}SO_3^-$ | 419 ± 86 | 419 | 309 ± 34 | 309 | 237 ± 25 | 237 |
| $C_6F_{13}SO_3^-$ | 327 ± 52 | 98 | 61.9 ± 11.7 | 19 | 36.3 ± 7.4 | 11 |
| $C_4F_9SO_3^-$ | 3.09 ± 1.58 | 0.31 | 0.126 ± 0.084 | 0.0126 | 0.025 ± 0.015 | 0.0025 |

*Normalized to a feeding level of 3 mg/kg body weight per day.

The results in Table 6 show unexpectedly fast and effective elimination of $C_4F_9SO_3^-$ as demonstrated by the extremely small amounts found, particularly relative to $C_6F_{13}SO_3^-$ and $C_8F_{17}SO_3^-$. Immediately following completion of feeding, $C_6F_{13}SO_3^-$ was a factor of 1.3 lower than $C_8F_{17}SO_3^-$, but $C_4F_9SO_3^-$ was more than a factor of 100 lower than $C_6F_{13}SO_3^-$. At 28 days following completion of feeding, $C_6F_{13}SO_3^-$ was a factor of 6.5 lower than $C_8F_{17}SO_3^-$, but $C_4F_9SO_3^-$ was more than a factor of 1400 lower than $C_6F_{13}SO_3^-$. After normalization to the same feeding levels, at 28 days following completion of feeding, $C_6F_{13}SO_3^-$ was a factor of 21.5 lower than $C_8F_{17}SO_3^-$, but $C_4F_9SO_3^-$ was a factor of 4400 lower than $C_6F_{13}SO_3^-$.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims as set forth herein as follows.

What is claimed is:

1. A method of reducing the surface tension of a solution comprising:
   a) providing an aqueous solution where a hydrocarbon surfactant would degrade; wherein said aqueous solution is selected from the group consisting of:
      (i) ammonium fluoride and hydrogen fluoride solution;
      (iii) an acid copper plating solution comprising copper sulfate and sulfuric acid;
      (iv) a CMP slurry comprising abrasive particles selected from the group consisting of alumina, silica, and cerium; oxidant, etchant, and corrosion inhibitors;
      (v) a wafer cleaning solution comprising $H_2O_2$, $O_3$, $H_2SO_4$, $NH_4OH$, or HCl alone or in combination;
      (vi) ethylenediamine or ethanolamine solutions; and
      (vii) chromium trioxide, other chromium (VI) ions, and sulfuric acid; and
   b) adding to said solution a surface active agent comprising a bis(perfluoroalkanesulfonyl)imide or its salts.

2. The method of reducing the surface tension of a solution according to claim 1, wherein said bis (perfluoroalkanesulfonyl)imide is represented by the formula:

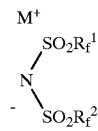

where $R_f^1$ and $R_f^2$ are independently a perfluoroalkyl group comprising from 1 to 12 carbon atoms, and M is H or an inorganic or organic cation.

3. The method of reducing the surface tension of a solution according to claim 2, wherein $R_f^1$ and $R_f^2$ independently comprise from 2 to 6 carbon atoms.

4. The method of reducing the surface tension of a solution according to claim 2, wherein $R_f^1$ and $R_f^2$ independently comprise from 3 to 5 carbon atoms.

5. The method of reducing the surface tension of a solution according to claim 1, wherein said bis (perfluoroalkanesulfonyl)imide is bis (perfluorobutanesulfonyl)imide.

6. The method of reducing the surface tension of a solution according to claim 1, wherein said bis (perfluoroalkanesulfonyl)imide salt comprises a cation selected from the group consisting of alkali metal cations, alkaline earth metal cations, $H^+$, $H_3O^+$, $NH_4^+$, $Cu^{2+}$, $Zn^{2+}$, and organo-nitrogen, organo-oxygen, and organo-phosphorous onium cations.

7. The method of reducing the surface tension of a solution according to claim 6, wherein said cation is selected from the group consisting of $H^+$, $NH_4^+$, $H_3O^+$, $Na^+$, $K^+$, $Li^+$, $Mg^{2+}$, $Ca^{2+}$, $Zn^{2+}$, and $Cu^{2+}$.

* * * * *

UNITED STATES PATENT AND TRADEMARK OFFICE
CERTIFICATE OF CORRECTION

PATENT NO.      : 6,555,510 B2
DATED           : April 29, 2003
INVENTOR(S)     : Lamanna, William M.

It is certified that error appears in the above-identified patent and that said Letters Patent is hereby corrected as shown below:

Title page,
Item [57], ABSTRACT,
Line 3, delete "additives applications" and insert in place thereof -- additives for applications --
Item [56], References Cited, OTHER PUBLICATIONS, "Article: Brace," reference, delete "Vo." and insert in place thereof -- vol. --

Column 4,
Line 11, delete "octanel" and insert in place thereof -- octanyl --

Column 5,
Lines 3-4, delete "Chemisitry" and insert in place thereof -- Chemistry --
Line 43, delete "—$CH_2CH_2$_" and insert in place thereof -- —$CH_2CH_2$— --

Column 6,
Lines 9-10, delete "perflurobutanesulfonyl" and insert in place thereof -- perfluorobutanesulfonyl --
Line 14, delete "perflurobutanesulfonyl" and insert in place thereof -- perfluorobutanesulfonyl --
Line 28, delete "SO2" and insert in place thereof -- $SO_2$ --

Column 7,
Line 7, delete "solution, in" and insert in place thereof -- solution in --

Column 11,
Line 4, delete "following. non-limiting" and insert in place thereof -- following non-limiting --
Line 45, delete "$(C_2H_5)_3NH^+\!^-N(SO_2C_4F_{9)2}$" and insert in place thereof -- $(C_2H_5)_3NH^{+-}N(SO_2C_4F_9)_2$ --

Column 12,
Line 49, delete "-N" and insert in place thereof -- +-N --

Column 13,
Line 14, delete "[OCH2CH2]" and insert in place thereof -- [$OCH_2CH_2$] --
Lines 20 and 49, delete "and" and insert in place thereof -- an --
Lines 36-37 and 65-66, delete "perfluroalkanesulfonate" and insert in place thereof -- perfluoroalkanesulfonate --
Line 37, delete "(DBI)2" and insert in place thereof -- $(DBI)_2$ --
Line 42, delete "$CH^3$" and insert in place thereof -- $CH_3$ --
Line 43, delete "$^x$NH3+]" and insert in place thereof -- $x$NH3+] --

UNITED STATES PATENT AND TRADEMARK OFFICE
CERTIFICATE OF CORRECTION

PATENT NO. : 6,555,510 B2
DATED : April 29, 2003
INVENTOR(S) : Lamanna, William M.

It is certified that error appears in the above-identified patent and that said Letters Patent is hereby corrected as shown below:

Column 13 cont.,
Line 44, delete "$(CH_3))_zNH_3^{+][-}N(SO_2C_4F_9)_{2]3}$" and insert in place thereof
-- $(CH_3))_zNH_3^+]$ $[^-N(SO_2C_4F_9)_2]_3$ --
Line 66, delete "(DBI)3T-403" and insert in place thereof -- $(DBI)_3$ T-403 --

Column 14,
Lines 8 and 33, delete "(DBI)2" and insert in place thereof -- $(DBI)_2$ --
Line 34, delete "NH4" and insert in place thereof -- $NH_4$ --
Line 57, delete "Methacylate" and insert in place thereof -- Methacrylate --

Column 15,
Line 5, delete "Organomettalics" and insert in place thereof -- Organometallics --

Column 16,
Line 28, delete "$Mg(SO_3C_4F_9)_2$ $6H_2O$" and insert in place thereof
-- $Mg(SO_3C_4F_9)_2$ $6H_2O$ --

Column 17,
Line 17, the following should be added -- (ii) tetramethyl ammonium hydroxide solution; --
Line 23, delete "$O_3,$" and insert in place thereof -- $O_3$ --
Line 24, delete "HCI alone" and insert in place thereof -- HCI, alone --
Line 25, delete "(vi) ethylenediamine, or ethanolamine solutions; and" and insert in place thereof -- (vi) ammonium hydroxide solution, quaternary ammonium hydroxides, ethylenediamine, or ethanolamine solutions; and --

Signed and Sealed this

Sixth Day of July, 2004

JON W. DUDAS
*Acting Director of the United States Patent and Trademark Office*